United States Patent [19]

Kawanabe et al.

[11] Patent Number: 4,795,720
[45] Date of Patent: Jan. 3, 1989

[54] METHOD FOR PRODUCING SEMICONDUCTOR DEVICES AND CUTTING FUSES

[75] Inventors: Takao Kawanabe, Tokorozawa; Morio Inoue, Koganei; Mikio Hongo, Yokohama, all of Japan

[73] Assignee: Hitachi, Ltd., Tokyo, Japan

[21] Appl. No.: 96,778

[22] Filed: Sep. 14, 1987

Related U.S. Application Data

[63] Continuation of Ser. No. 753,851, Jul. 11, 1985, abandoned.

[30] Foreign Application Priority Data

Jul. 11, 1984 [JP] Japan .................................. 59-142330

[51] Int. Cl.[4] .................... H01L 21/465; H01L 21/473
[52] U.S. Cl. ........................................... 437/52; 437/922
[58] Field of Search .................................. 437/922, 52

[56] References Cited

U.S. PATENT DOCUMENTS

| | | | |
|---|---|---|---|
| 4,240,094 | 12/1980 | Mader | 357/45 |
| 4,455,194 | 6/1984 | Yabu et al. | 156/653 |
| 4,503,315 | 3/1985 | Kamioka et al. | 219/121 |
| 4,569,121 | 2/1986 | Lim et al. | 437/52 |
| 4,602,420 | 7/1986 | Saito | 29/571 |

FOREIGN PATENT DOCUMENTS 0025347 11/1981 European Pat. Off. .
104141 6/1984 Japan .................................. 427/53.1

OTHER PUBLICATIONS

Baurle, 'Laser Induced Chemical Vapor Deposition', Surface Studies with Lasers, Proc. of International Conf. Mauterndof Austria, Mar. 1983, pp. 178–188.
Chang, 'Writing $SiO_2$ on a Si Wafer', IBM Tech. Bulletin, vol. 20, No. 6, Nov. 77.
Boyer et al., 'Laser-Induced Chemical Vapor Deposition of $SiO_2$', Applied Physics Letters, vol. 40, No. 8, Apr. 82, pp. 716–719.

Primary Examiner—George T. Ozaki
Attorney, Agent, or Firm—Antonelli, Terry & Wands

[57] ABSTRACT

Herein disclosed are a method of producing a semiconductor device. Especially in a device constructed to have a defective circuit replaced by a redundant circuit, after a fuse is cut by exposure to a laser beam, a portion to be fused is irradiated in a predetermined gas atmosphere with an optical ray to selectively form a CVD film thereby to form a protection film over the fuse so that the formation of the protection film is simplified after the fuse is cut, whereby any rise in the production cost is suppressed while improving the production yield and reliability.

44 Claims, 4 Drawing Sheets

METHOD FOR PRODUCING SEMICONDUCTOR DEVICES AND CUTTING FUSES

This application is a continuation application of application Ser. No. 753,851, filed July 11, 1985 and now abandoned.

BACKGROUND OF THE INVENTION

The present invention relates to a method of producing a semiconductor device, an apparatus for use in the method, and an article produced by the method. More specifically, the present invention relates to a novel method of and a novel apparatus for relieving a defective circuit in a circuit such as an LSI (i.e., Large Scale Integrated) circuitin the producing process of a semiconductor device by making use of a redundant circuit.

In a semiconductor device, especially, in a semiconductor memory device composed of a number of circuits having an identical structure, in order to prevent the device as a whole from becoming defective by the defect of a portion of the circuits thereby to improve the production yield of the device, there has been adopted a method by which the so-called "redundant circuit" is formed integrally with the device so that the defective circuit may be replaced by that redundant circuit. In the semiconductor device having the redundant circuit structure, rows and columns containing the defective bits are replaced by the spare rows and columns by making use of the programming technique.

A fuse is used for that circuit replacement and is made of polycrystalline silicon (i.e., polysilicon) or the like to form a part of the redundant circuit so that it may be electrically cut to effect the defect relief (or the circuit replacement). Incidentally, an RAM (i.e., Random Access Memory) of large capacitance having the redundant structure is disclosed in NIKKEI ELECTRONICS, 1981. 12. 7, pp. 219 to 226, which was published in December, by Nikkei-MacGraw-Hill, Inc.

Here, the following two methods are conceivablee as that defect relieving method. As shown in FIGS. 4(A) to 4(C), specifically, a fuse 1 is formed of a polysilicon or metal silicide film on the surface insulating film 3 of a semiconductor substrate or a silicon substrate 2 and is overlaid by interlayer insulating films (such as a $SiO_2$ film 4, a first PSG film 5 and a second PSG film 6), an aluminum wiring film 7 and by a protection film 8 such as a plasma silicon nitride film. And, the fuse 1 is fused by exposure to a laser beam. Since the aforementioned protection film 8 shields the beam, however, it is formed in advance with an opening (or aperture) 9, as shown in FIG. 4(A), so that the fuse 1 may be exposed through that opening 9 to a laser beam 10, as shown in FIG. 4(B), and may be fused to replace the circuit. In addition, as shown in FIG. 4(C), another protection film 11 is formed again to protect the aforementioned opening. According to the second method shown in FIGS. 5(A) to 5(C), on the other hand, characteristic inspections are conducted to fuse the fuse 1 before the protection film is formed, as shown in FIGS. 5(A) and 5(B), and then the protection film 11 is first formed, as shown in FIG. 5(C), to protect the respective portions.

Despite this fact, the former method described with reference to FIGS. 4(A) to 4(C) is required to have the two steps of forming the protection films so that the number of steps is increased to raise a problem that the production cost is increased. On the other hand, the latter method described with reference to FIGS. 5(A) to 5(C) has to conduct the characteristic inspections and the relief in the absence of the protection film 11, although the step number is not increased, with a resultant fear that the product may be contaminated by the intervening handling or the like to raise a problem that the production yield and/or reliability is degraded.

SUMMARY OF THE INVENTION

An object of the present invention is to provide a novel method of producing a semiconductor device, which can cut a fuse and form a protection film while suppressing the increase in the number of the steps of forming the protection film to prevent any rise of the production cost and while preventing the yield and reliability from being degraded by contaminations or the like.

Another object of the present invention is to provide a novel producing apparatus which can execute the above-specified semiconductor device producing method with a simplified structure and can improve the operation efficiency.

Still another object of the present invention is to provide a novel semiconductor device which is produced by the above-specified novel producing apparatus.

The above and further objects and novel features of the invention will more fully appear from the following description and the accompanying drawings.

Representatives of the inventions to be disclosed herein are summarized in the following.

After a fuse is cut by exposure (emission) to a laser beam, specifically, a portion to be fused is irradiated in a predetermined gas atmosphere with an optical ray to selectively form a CVD film thereby to form a protection film over the fuse so that the formation of the protection film is simplified after the fuse is cut, whereby any rise in the production cost is suppressed while improving the production yield and reliability.

Moreover, by providing a chamber in which a sample such as a semiconductor wafer formed with a semiconductor device can be disposed, optical emission means for exposing (emitting) the sample in the chamber selectively to an optical ray such as a laser beam, and gas supply means for setting the space in the chamber in a desired gas atmosphere, it is possible to conduct the cutting of the fuse and the formation of the protection film in a portion to be fused easily and promptly.

BRIEF DESCRIPTION OF THE DRAWINGS

The aforementioned and other objects and novel features and advantages of the present invention will become apparent from the description herein with reference to the accompanying drawings, in which:

As shown in FIG. 1(A), specifically, a silicon substrate 20, which is formed with a desired circuit such as the RAM by a wafer treatment belonging to the fabricating process of the semiconductor device, has a surface insulating film 21 formed thereon, and on insulating film 21 is formed a fuse 22, the fuse being formed of a polysilicon film which in turn forms a part of a redundant circuit. The fuse 22 has interlayer insulating films, such as a $SiO_2$ film 23 and a first PSG (i.e., Phospho-Silicate Glass) film 24, formed on its surface. Through a contact hole formed in those interlayer insulating films, moreover, there is formed an aluminum wiring film 25 which is connected with the not-shown redundant circuit or main circuit. On those interlayer insulating films, there is formed a second PSG film 26 which is overlaid by a relatively thick protection film 27 made of a plasma silicon nitride film by a plasma treatment. As it is, moreover, the fuse 22 is left difficult to cut by the shield of the protection film 27 even it is exposed to a laser beam. Therefore, the protection film 27 corresponding to the generally central portion of the fuse 22 is formed with an (opening) aperture 28 by a photoetching technique.

Figure 1A:
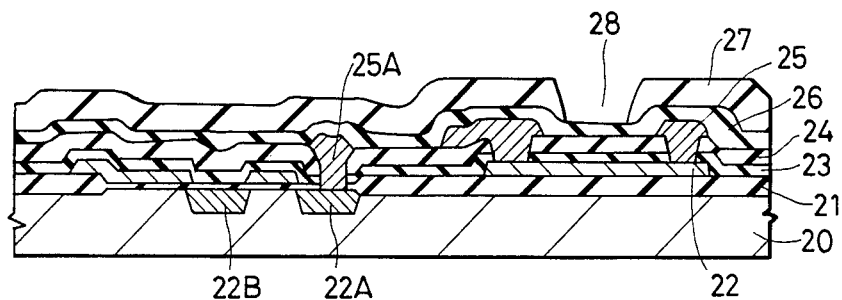
FIGS. 1(A) to 1(C) are sectional views showing the steps of a method of producing a semiconductor device according to the present invention.

Also shown in FIG. 1(A) are reference characters 22B and 22A, denoting source and drain regions of, e.g., a MISFET formed in substrate 20, and reference character 25A, denoting a contact to region 22A.

Figure 1B:
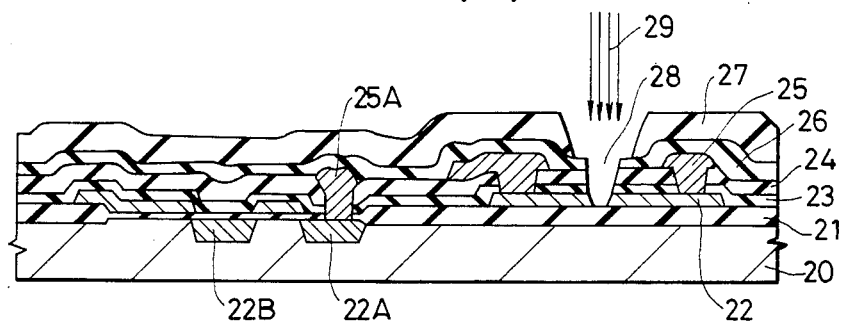

If a defect of the main circuit is found out by predetermined characteristic inspections, then the fuse 22 is exposed to a laser beam 29, as shown in FIG. 1(B), so that it may be accordingly cut. As a result, the fuse 22 is fused together with the second PSG film 26, the first PSG film 24 and the $SiO_2$ film 23 by the energy of the laser beam 29 impinging through the opening 28 of the protection film 27, thereby to effect the replacement of the defective circuit by the redundant circuit, i.e., the relief of the defect.

As seen in FIG. 1(B), after the fuse 22 has been cut, the insulating film 21 thereunder is exposed. Incidentally, in order to enhance the fusing efficiency in this case, the laser beam 29 used has a wavelength in the vicinity of 500 nm where it has a high spectroscopic absorptivity by the polysilicon.

Figure 1C:
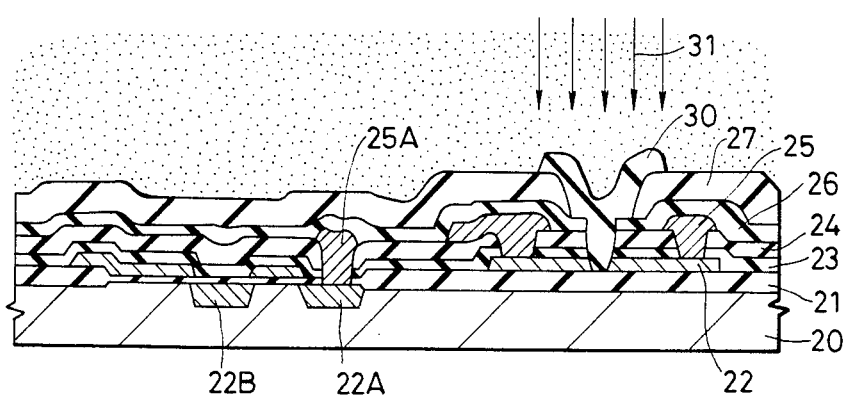

Then, the substrate 20 is placed in a reactive gas atmosphere of $SiH_4 + N_2O$ or the like, as shown in FIG. 1(C), and has its portion corresponding to the fuse 22 exposed selectively to a laser beam 31 or another optical ray (such as that of a mercury lamp) while being more or less heated, if necessary. As a result, a chemical reaction is caused in only the exposed portion by the optical energy so that a protection film 30 made of silicon oxide $SiO_2$, is formed by the optical CVD (e.g., spot deposition) only in the vicinity of the fuse 22 to protect the fuse 22. The reaction is expressed by the following formula and is conducted under a vacuum of 0.3 to 1.0 Torr by the use of a mercury catalyzer:

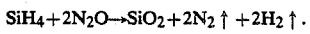

$$SiH_4 + 2N_2O \rightarrow SiO_2 + 2N_2 \uparrow + 2H_2 \uparrow.$$

It has been confirmed that the catalyzer mercury is not contained in the formed film. Incidentally, it is conceivable that the mercury catalyzer can be dispensed with if disilane ($Si_2H_6$) is used.

Since the protection film 30 can be caused to grow while being heated to about 200° C., if necessary, the substrate and the formed film have such a small difference in thermal expansion that any stress is avoided. Since the damage is also avoided, as is different from that of the plasma CVD film, moreover, the protection film has excellent characteristics to a satisfactory extent.

Incidentally, the compounds $Si_xN_yO_z$ and $SiO_2$ can be caused to grow by using $SiH_4$, $NH_3$ and $N_2O$. The growing temperature is thought to be at about 200° C. or lower.

Incidentally, the laser beam can be exemplified by a variety of lasers such as carbon dioxide ($CO_2$) lasers, argon (Ar) lasers, YAG lasers, or excimer lasers and preferably have a high optical energy. Moreover, the laser beam may be replaced by either an ultraviolet ray generated by a mercury lamp or a visible ray.

Since the silicon substrate 20 having the semiconductor element is already provided with the protection film 27, according to the present method, it is neither contaminated nor damaged before the relief of the defect and during the intervening handling so that the production yield and reliability can be improved. Since it is sufficient to form the protection film 30 in a portion after the defect relief, moreover, the production facilities can be simplified more than in the case in which the protection film is formed all over the surface, and the troubles and time period for the production process can be reduced. This makes it possible to reduce the number of the producing steps and the production cost.

Figure 2:
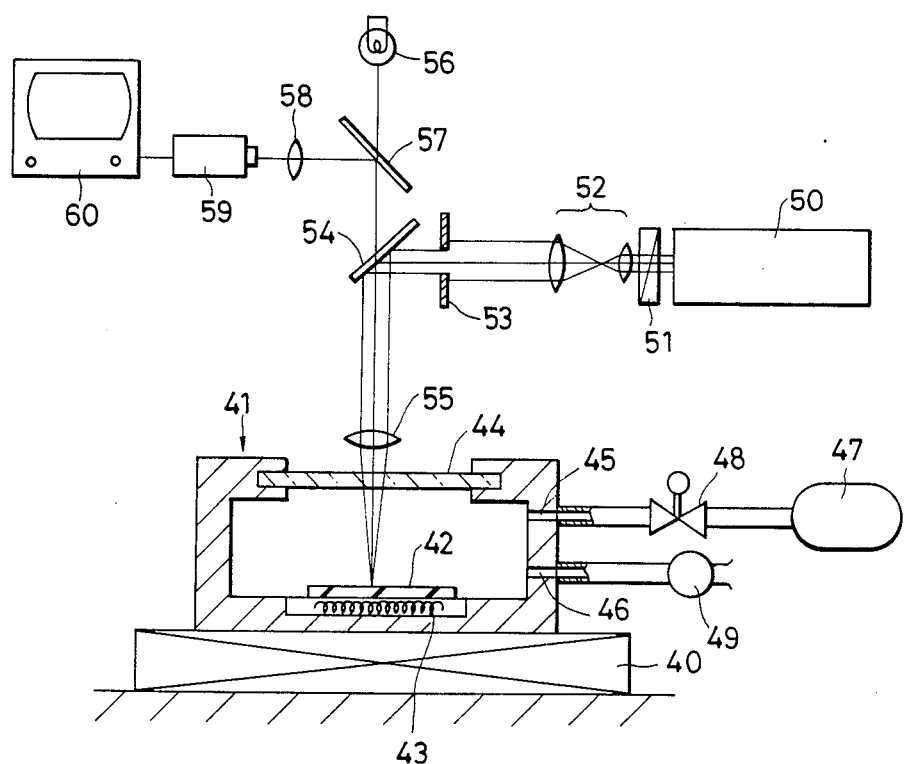
FIG. 2 is a schematic view showing the overall structure of one embodiment of a producing apparatus according to the present invention.

FIG. 2 shows one embodiment of apparatus for producing the aforementioned semiconductor device.

On an XY table 40 to be moved in a plane XY, as shown in FIG. 2, there is placed a sealed chamber 41, in which a silicon substrate (or the semiconductor device) 42 can be disposed. The chamber 41 is equipped with a heater 43 in its bottom and formed with a transparent aperture 44 of quartz or the like in its top face. The chamber 41 has a gas supply port 45 and a gas discharge port 46 provided at a side thereof, which are equipped with gas supply means such that the former is connected with a source 47 for the aforementioned gases such as $SiH_4$ or $N_2O$ and an on-off valve 48 whereas the latter is connected with an evacuating pump 49.

Above the aforementioned chamber 41, on the other hand, there is arranged laser beam emitting means. This laser beam emitting means includes a variable frequency laser source 50, a wavelength selector 51 such as a filter, a condenser lens 52, an aperture 53, a half mirror 54, and a focusing lens 55 so that a laser beam having a desired wavelength can be focused by the focusing lens 55 to irradiate the substrate 42 in the chamber 41 through the transparent aperture 44. To the aforementioned half mirror 54, moreover, there is attached an observing optical system, which is equipped with a white lamp 56, a half mirror 57, a relay lens 58, a TV (i.e., television) camera 59, and a TV monitor 60 so that it can allow the observation of the surface of the aforementioned substrate 42 through the TV monitor 60.

According to this producing apparatus, therefore, the silicon substrate 42 for the defect relief is disposed in the chamber 41, and the fuse is positioned with respect to the optical axis of the focusing lens 55 by the XY table 40. If the fuse is then exposed to the laser beam coming from the laser beam source, it can be fused. After this fusing step, moreover, the chamber 41 is evacuated by the evacuating pump 49 and is filled up with the reactive gases from the gas source 47 by opening the valve 48. Then, the chamber 41 can have its space set in the desired gas pressure atmosphere. If the fuse 22 is then exposed again to the laser beam (which has a smaller coherency than that of the preceding beam and has a suitably changed wavelength), the substrate 42 is formed selectively with the film (i.e., the protection film) on its surface by the optically excited reaction of the reactive gases in the portion exposed to the laser beam. If necessary, incidentally, the substrate 42 may be heated by the heater 43 to promote the film formation.

According to the present invention, there can be provided a continuous producing apparatus which is enabled to continuously conduct the step of supplying the sample to the apparatus, the step of irradiating the sample with the optical ray to cut the fuse, the step of forming the protection film on the sample by the optically excited reaction, and the step of taking out the sample.

In this contiuous production, according to the present invention, the reactive gases for forming the protection film are supplied to the chamber continuously from the cutting step of the fuse and so on, and the sample is irradiated with the optical ray, which has such a power and a wavelength as to cut the fuse and so on without any optically excited reaction, to ensure the cutting of the fuse and so on. Then, the power and the wavelength of the optical ray are changed to cause the optically excited reaction of the reactive gases so that the sample can be formed with the protection film. In this case, the laser beam source to be used for various purposes by changing the optical power and wavelength may be exemplified by either one light source to change the power and wavelength thereof or a plurality of light sources.

Figure 3:
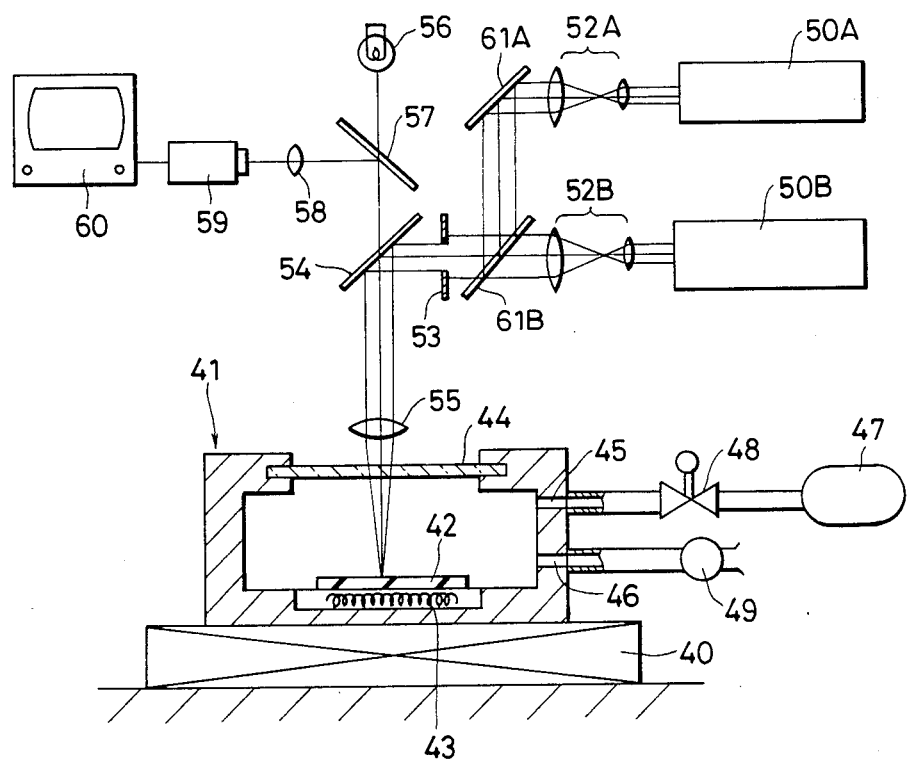
FIG. 3 is also a schematic view but shows another embodiment of the producing apparatus according to the present invention.
Figure 4A:
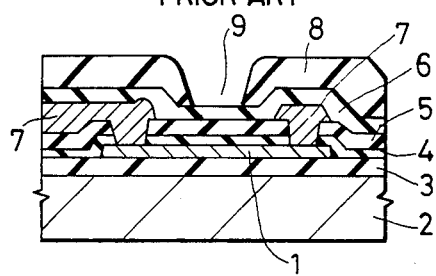
FIGS. 4(A) to 4(C) and FIGS. 5(A) to 5(C) are sectional views showing the different semiconductor device producing methods having been described in the section of the present application entitled "Background of the present invention".
Figure 5A:
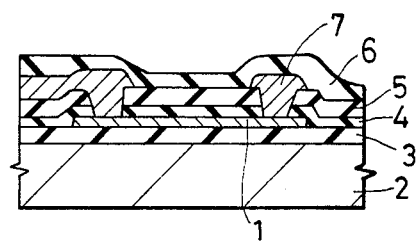
Figure 4B:
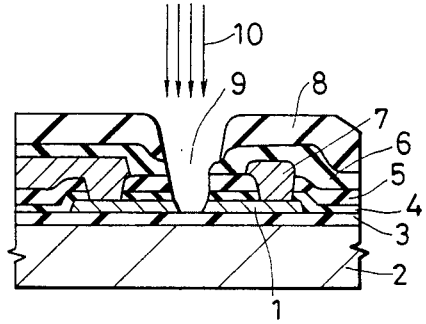
Figure 5B:
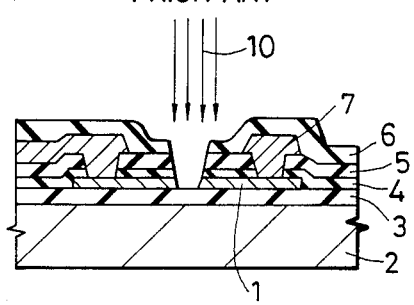
Figure 4C:
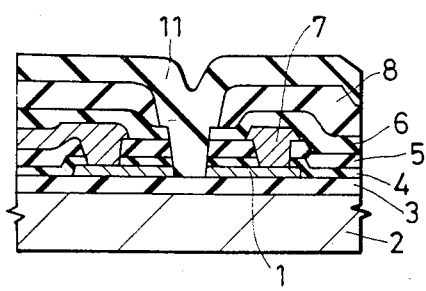
Figure 5C:
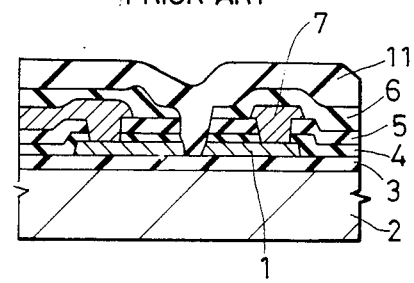

FIG. 3 shows another embodiment of the producing apparatus according to the present invention, and the same parts as those of FIG. 2 are indicated with common reference numerals. In this embodiment, there are provided two laser beam sources 50A and 50B having different wavelengths, to which condenser lenses 52A and 52B and half mirrors 61A and 61B are accordingly attached. With this structure, the substrate 42 can be irradiated with the laser beam having the desired wavelength merely by selecting either of the laser beam sources 50A and 50B so that these laser beam sources can be easily switched for the cutting of the fuse and the formation of the film. The supplies of the gases to the space of the chamber 41 are absolutely identical to those of the preceding embodiment. In the present embodiment, replacement of one laser beam source by a mercury lamp or the like may be made and is effective especially in case the film formation is conducted by the optical ray of the mercury lamp.

The method of and apparatus of the semiconductor device according to the present invention and the semiconductor device produced thereby have the following several effects.

(1) In order to replace the defective circuit, the fuse is exposed to the laser beam and is cut and the portion corresponding to the fuse is irradiated with the optical ray in the reactive gas atmosphere to form the protection film selectively. As a result, the semiconductor device is prevented by the previously formed protection film from being contaminated and damaged so that the production yield and reliability can be improved, and the formation of the final protection film is facilitated so that the number of all the steps to replace the defective circuit can be decreased to achieve the reduction of the production cost.

(2) There are provided a chamber which has disposed therein the semiconductor device in the wafer state, a gas supply means for supplying the reactive gas atmosphere to the chamber so that the semiconductor wafer is in an atmosphere of the reactive gas, and an optical emission means for exposing the semiconductor device in the wafer state selectively to the optical ray. As a result, replacement of defective circuit can be conducted merely by exposing the semiconductor device selectively to the optical ray so that it can be speeded up and facilitated.

(3) The laser beam and the other optical ray are made to have different wavelengths for the fuse cutting operation and for the protection film forming operation. These operations can be conducted with the most proper wavelengths so that their efficiency can be improved.

The inventions made by me has been specifically described in connection with the embodiments thereof but should not be limited thereto. It goes without saying that the present invention can be modified in various manner without departing from the gist thereof. For example, the optical emission means can be assembled in the chamber. Moreover, the protection film may be made of silicon nitride or other materials. In this modification, it is advisable to change not only the kinds of the reactive gases but also the wavelengths of the laser beam and other optical rays.

In the description thus far made, my invention has been described in case it is applied to the replacement of a defective circuit of a semiconductor device having the memory structure providing the background of the field of application thereof. However, the present invention should not be limited thereto but can be applied to replacement of defective circuits of the general semiconductor device which is equipped with the redundant circuit.

What is claimed is:

1. A method of producing a semiconductor device comprising the steps of:
   forming a first protection film over a semiconductor device having a main circuit and a fuse with a redundant circuit, the first protection film having an opening above said fuse, the fuse being formed on a surface;
   cutting said fuse to replace a defective main circuit by said redundant circuit, whereby in cutting said fuse said surface is exposed in said opening; and
   forming a second protection film selectively so as to completely cover the surface exposed in said opening.

2. A semiconductor device producing method according to claim 1, wherein said fuse is made of conductive polycrystalline silicon.

3. A method of producing a semiconductor device according to claim 1, wherein the fuse to be cut is covered by a phosphosilicate glass film.

4. A method of producing a semiconductor device according to claim 3, wherein said first and second protection films are a plasma silicon nitride film and a CVD-$SiO_2$ film, respectively.

5. A method of producing a semiconductor device according to claim 1, wherein said fuse is cut by exposing said fuse to an optical ray.

6. A method of producing a semiconductor device according to claim 5, wherein said optical ray is a laser beam.

7. A method of producing a semiconductor device according to claim 1, wherein said second protection film is formed by selective irradiating, of the location of the cut fuse, with an optical ray, in an atmosphere comprising SiH$_4$, NH$_3$ and N$_2$O.

8. A method of producing a semiconductor device according to claim 1, wherein the second protection film is formed selectively, only so as to completely cover the surface exposed in said opening and in the vicinity thereof.

9. A method of producing a semiconductor device according to claim 1, wherein the second protection film is a silicon oxide or silicon nitride film.

10. A method of producing a semiconductor device according to claim 9, wherein the second protection film is formed while being heated at a temperature of 200° C. or lower.

11. A method of producing a semiconductor device according to claim 1, wherein the second protection film is formed while being heated at a temperature of 200° C. or lower.

12. A method of producing a semiconductor device according to claim 1, wherein said fuse has on the fuse surface, under the first protection film, at least one interlayer insulating film, so as to prevent exposure of the fuse; and, in addition to cutting said fuse, said at least one interlayer insulating film is also cut, so as to expose said surface in said opening.

13. A method of producing a semiconductor device according to claim 12, wherein said at least one interlayer insulating film is selected from the group consisting of silicon oxide and phosphosilicate glass.

14. A method of producing a semiconductor device according to claim 13, wherein said at least one interlayer insulating film includes a first layer, of silicon oxide, adjacent the fuse, and a second layer, of phosphosilicate glass, on the first layer.

15. A method of producing a semiconductor device according to claim 1, wherein the second protection film is selectively formed by deposition.

16. A method of producing a semiconductor device according to claim 15, wherein said deposition is a spot deposition.

17. A method of producing a semiconductor device according to claim 16, wherein the second protection film is deposited so as to plug up said opening, whereby the cut fuse and exposed surface are covered.

18. A method of producing a semiconductor device according to claim 17, wherein said surface underlying said fuse is a surface of an insulating layer formed on the semiconductor substrate.

19. A method of producing a semiconductor device comprising the steps of:
positioning a semiconductor device in a chamber, the semiconductor device having a main circuit, a fuse with a redundant circuit and a first protection film over said semiconductor device, the fuse being formed on a surface, the first protection film having an opening above said fuse;
cutting said fuse to replace a defective circuit by said redundant circuit, whereby in cutting said fuse said surface is exposed in said opening;
filling the chamber with reactive gases which react to form material of a second protection film; and
exposing the location of the cut fuse to an optical ray to form the second protection film selectively so as to completely cover the surface exposed in said opening.

20. A method of producing a semiconductor device according to claim 19, wherein said fuse is cut by exposing said fuse to an optical ray.

21. A semiconductor device producing method according to claim 20, wherein a laser beam is used for cutting the fuse, and the laser beam for cutting said fuse and the optical ray used to form the second protection film selectively are made to have different wavelengths.

22. A method of producing a semiconductor device according to claim 20, wherein said optical ray for cutting said fuse is a laser beam.

23. A method of producing a semiconductor device according to claim 19, wherein the fuse to be cut is covered by a phosphosilicate glass film.

24. A method of producing a semiconductor device according to claim 23, wherein said first and second protection films are a plasma silicon nitride film and a CVD-SiO$_2$ film, respectively.

25. A method of producing a semiconductor device according to claim 19, wherein said reactive gases contain monosilane and nitrogen monoxide.

26. A method of producing a semiconductor device according to claim 19, wherein said optical ray is a laser beam.

27. A method of producing a semiconductor device according to claim 19, wherein the second protection film is formed selectively, only so as to completely cover the exposed surface exposed in the opening and in the vicinity thereof.

28. A method of producing a semiconductor device according to claim 19, wherein the second protection film is formed by depositing the material of the second protection film so as to completely cover the surface exposed in said opening.

29. A method of producing a semiconductor device according to claim 19, wherein said fuse has on the fuse surface, under the first protection film, at least one interlayer insulating film, so as to prevent exposure of the fuse; and, in addition to cutting said fuse, said at least one interlayer insulating film is also cut, so as to expose said surface in said opening.

30. A method of producing a semiconductor device according to claim 29, wherein said at least one interlayer insulating film is selected from the group consisting of silicon oxide and phosphosilicate glass.

31. A method of producing a semiconductor device according to claim 30, wherein said at least one interlayer insulating film includes a first layer, of silicon oxide, adjacent the fuse, and a second layer, of phosphosilicate glass, on the first layer.

32. A method of producing a semiconductor device according to claim 39, wherein said fuse has at least one interlayer insulating film provided on the upper surface thereof, so as to prevent exposure of said fuse, said first protection film being formed over said at least one interlayer insulating film; and wherein, in addition to cutting said fuse, said at least one interlayer insulating film is also cut, so as to expose said surface in said opening.

33. A method of producing a semiconductor device according to claim 32, wherein said at least one interlayer insulating film is selected from the group consisting of silicon oxide and phosphosilicate glass.

34. A method of producing a semiconductor device according to claim 33, wherein said at least one interlayer insulating film includes a first layer, of silicon oxide, adjacent the fuse, and a second layer, of phosphosilicate glass, on the first layer.

35. A method of producing a semiconductor device according to claim 19, wherein the second protection film is selectively formed by deposition.

36. A method of producing a semiconductor device according to claim 35, wherein said deposition is a spot deposition.

37. A method of producing a semiconductor device according to claim 36, wherein the second protection film is deposited so as to plug up said opening, whereby the cut fuse and exposed surface are covered.

38. A method of producing a semiconductor device according to claim 37, wherein said surface underlying said fuse is a surface of an insulating layer formed on the semiconductor substrate.

39. A method of producing a semiconductor device having a main circuit and a fuse with a redundant circuit connected to the fuse by an aluminum wiring film, the fuse being formed on a surface, comprising the steps of:
   forming a first protection film over said aluminum wiring film, the first protection film having an opening above said fuse;
   cutting said fuse to replace a defective main circuit by said redundant circuit, whereby in cutting said fuse the surface is exposed in said opening; and
   forming a second protection film selectively so as to completely cover the surface exposed in said opening.

40. A method of producing a semiconductor device according to claim 39, wherein the second protection film is formed selectively, only so as to cover the surface exposed in said opening and in the vicinity thereof.

41. A method of producing a semiconductor device according to claim 39, wherein the second protection film is selectively formed by deposition.

42. A method of producing a semiconductor device according to claim 41, wherein said deposition is a spot deposition.

43. A method of producing a semiconductor device according to claim 42, wherein the second protection film is deposited so as to plug up said opening, whereby the cut fuse and exposed surface are covered.

44. A method of producing a semiconductor device according to claim 43, wherein said surface underlying said fuse is a surface of an insulating layer formed on the semiconductor substrate.

* * * * *